United States Patent
Sunaga et al.

(10) Patent No.: US 6,650,573 B2
(45) Date of Patent: Nov. 18, 2003

(54) DATA INPUT/OUTPUT METHOD

(75) Inventors: Toshio Sunaga, Ohtsu (JP); Shinpei Watanabe, Yokohama (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/063,059

(22) Filed: Mar. 15, 2002

(65) Prior Publication Data

US 2002/0141266 A1 Oct. 3, 2002

(51) Int. Cl.[7] .................................................. G11C 7/00
(52) U.S. Cl. ................... 365/189.05; 365/233; 711/167
(58) Field of Search ...................... 365/189.05, 189.04, 365/233; 711/167

(56) References Cited

U.S. PATENT DOCUMENTS

| | | | |
|---|---|---|---|
| 5,835,446 A | * | 11/1998 | Park .......................... 365/233 |
| 5,923,595 A | * | 7/1999 | Kim ....................... 365/189.05 |
| 6,081,479 A | * | 6/2000 | Ji et al. ....................... 365/233 |

* cited by examiner

*Primary Examiner*—Vu A. Le
*Assistant Examiner*—Jung H. Hur
(74) *Attorney, Agent, or Firm*—Anthony J. Canale

(57) ABSTRACT

The present invention discloses a method for data input/output for memory which minimizes losses of data interruption when switching between reading and writing. A method for data input/output comprises the steps of: holding predetermined data from memory array 12 upon m-th (m is integer) read command; outputting the predetermined data to common I/O 30 and holding new data from memory array 12 upon (m+1)-th read command; holding predetermined data from common I/O 30 upon n-th (n is integer) write command; and storing the predetermined data in memory array 12 and holding new data from common I/O 30 upon (n+1)-th write command.

12 Claims, 7 Drawing Sheets

DATA INPUT/OUTPUT METHOD

BACKGROUND OF THE INVENTION

1. Field of the Invention

The present invention relates to a method for data input/output for a memory. More particularly, the present invention relates to a method for data input/output for a memory that minimizes data interruption when switching between reading and writing.

2. Background of the Invention

DRAM has been a bottleneck for improving the performance of computers since the speed of DRAM is slower than the microprocessor unit (MPU). Therefore, various kinds of fast schemes, such as a burst mode of SDRAM (Synchronous Dynamic RAM) and RAMBUS, are utilized. These are all based on the page mode where data are retrieved from the conventional sense amplifiers that latches the data. A large number of sense amplifiers are activated such that data to be accessed could possibly be at the addresses of the sense amplifiers that have already been activated. Furthermore, a number of banks may be provided to make the number of data latched in the sense amplifiers large, or another bank may be accessed when an access is made to an address that does not exist in the sense amplifiers latched in a bank, in order to achieve an increase in speed.

BRIEF SUMMARY OF THE INVENTION

Under practical use conditions of a semiconductor memory where data is stored and retrieved, such as DRAM, an access to memory is essentially random row access where any row address (word line) is accessed. Though these memories are practically used in the random row access mode, these memories tend to avoid this access as much as possible and rely on the page mode or banks for increasing speed. As a result, when accesses occur in the same bank, data are interrupted between the bursts. Particularly, it has a significant affect when reading and writing are switched one after the other.

FIG. 5 depicts an example for SDRAM DDR (Double Data Rate). FIG. 5 shows the case where reading from and writing to addresses in the same bank occur alternately under the conditions where CAS (Column Address Strobe) latency is two and the burst length is eight. It is evident from the drawing that there are long empty periods between the bursts in terms of data I/O. There are 18 clocks for one cycle of reading and writing, during which 8 bursts of reading and 8 bursts of writing are performed on both edges of the clock. Therefore, among 36 clock edges, only 16 clock edges are involved in the processing of data. Namely, the data rate in this case is only 44% (=16/36) compared with the peak data rate where all edges are used. This means that even if the clock frequency is 200 MHz, an actual data rate is equivalent to 88 MHz. In this manner, in the practical random row access environment where reading and writing are frequently switched, there are drawbacks where the data rate can not be increased.

In order to cope with the problems associated with the random row access, a row-to-row seamless access will be described. A memory array is essentially composed of a matrix where word lines and bit lines are orthogonalized, wherein subsequent another address can not be accessed while either of which is operated. The period from onset of word line rising completion of bit line equalization is called the array time constant. In other words, the cycle time of memory can be reduced to this array time constant in theory. Based on this, row-to-row seamless access could become possible by greatly reducing the array time constant utilizing prefetch and preload to make it shorter than the time required for the burst.

FIG. 6 depicts an operation provided that the same reading and writing as that in FIG. 5 occurs alternately. In this case, the page mode is eliminated, wherein precharge occurs right after all the accesses have prefetched data or right after preloaded data has been written at a time, thus a command need not be divided into RAS (Row Address Strobe) and CAS (Column Address Strobe), whereby one command identified of its reading or writing is provided to a row and column addresses at the same time.

In FIG. 6, since the array time constant is reduced compared with FIG. 5, the empty period of time where no data exists is greatly reduced in the data I/O. There exists one clock of empty period between the bursts. This empty period is provided intentionally to avoid data contention on the bus between the memory and the driver of the controller chip. If both the chips use a driver of the type of open drain being pulled-up externally, this one clock of empty period is unnecessary, whereby all the bursts result in a seamless data stream. Therefore, in this case, an access is considered to be made at the peak data rate.

However, actual reading and writing may occur in any pattern rather than such a simple repetitive pattern. As shown in FIG. 7, for example, where reading occurs two times consecutively and writing occurs one time, data are processed using 24 clock edges among 42 clock edges, consequently the data rate is 57% (=24/42). This is better than the data rate of 44% in FIG. 5, but still considered to be low. Since the above-mentioned method uses separate buses between reading and writing, the reading and writing could be made at the same timing on the buses, whereby the array time constant for the writing could be placed right after the array time constant for the second reading. However, when a common I/O is used, it is difficult to increase the data rate.

It is therefore an object of the present invention to provide a method for data input/output for a memory which minimizes losses of data interruption when switching between reading and writing.

In one aspect of the present invention, there is provided a method for data input/output for DRAM that uses common I/O to read and write data, the method comprises the steps of: holding predetermined data from a memory array upon m-th (m is integer) read command; outputting the predetermined data to the common I/O and holding new data from the memory array upon (m+1)-th read command; holding predetermined data from the common I/O upon n-th (n is integer) write command; and storing the predetermined data in the memory array and holding new data from the common I/O upon (n+1)-th write command.

In another aspect of the present invention, there is provided a DRAM comprising a prefetch/latch circuit for holding data from a memory array and a preload/latch circuit for holding data from common I/O, wherein the prefetch/latch circuit comprises: means for holding predetermined data from the memory array upon m-th (m is integer) read command; means for outputting the predetermined data to the common I/O upon (m+1)-th read command; and means for holding new data from the memory array upon (m+1)-th read command; and wherein the preload/latch circuit comprises: means for holding predetermined data from the common I/O upon n-th (n is integer) write command; means for storing the predetermined data in the memory array upon (n+1)-th write command; and means for holding new data from the common I/O upon (n+1)-th write command.

BRIEF DESCRIPTION OF THE SEVERAL VIEWS OF THE DRAWINGS

The foregoing and other features of the invention will become more apparent upon review of the detailed description of the invention as rendered below. In the description to follow, reference will be made to the several figures of the accompanying Drawings, in which.

DETAILED DESCRIPTION OF THE INVENTION

Preferred embodiments of the method for data input/output for a memory, such as a semiconductor memory, and a memory using the method according to the present invention will be described with reference to the accompanying drawings.

Figure 1:
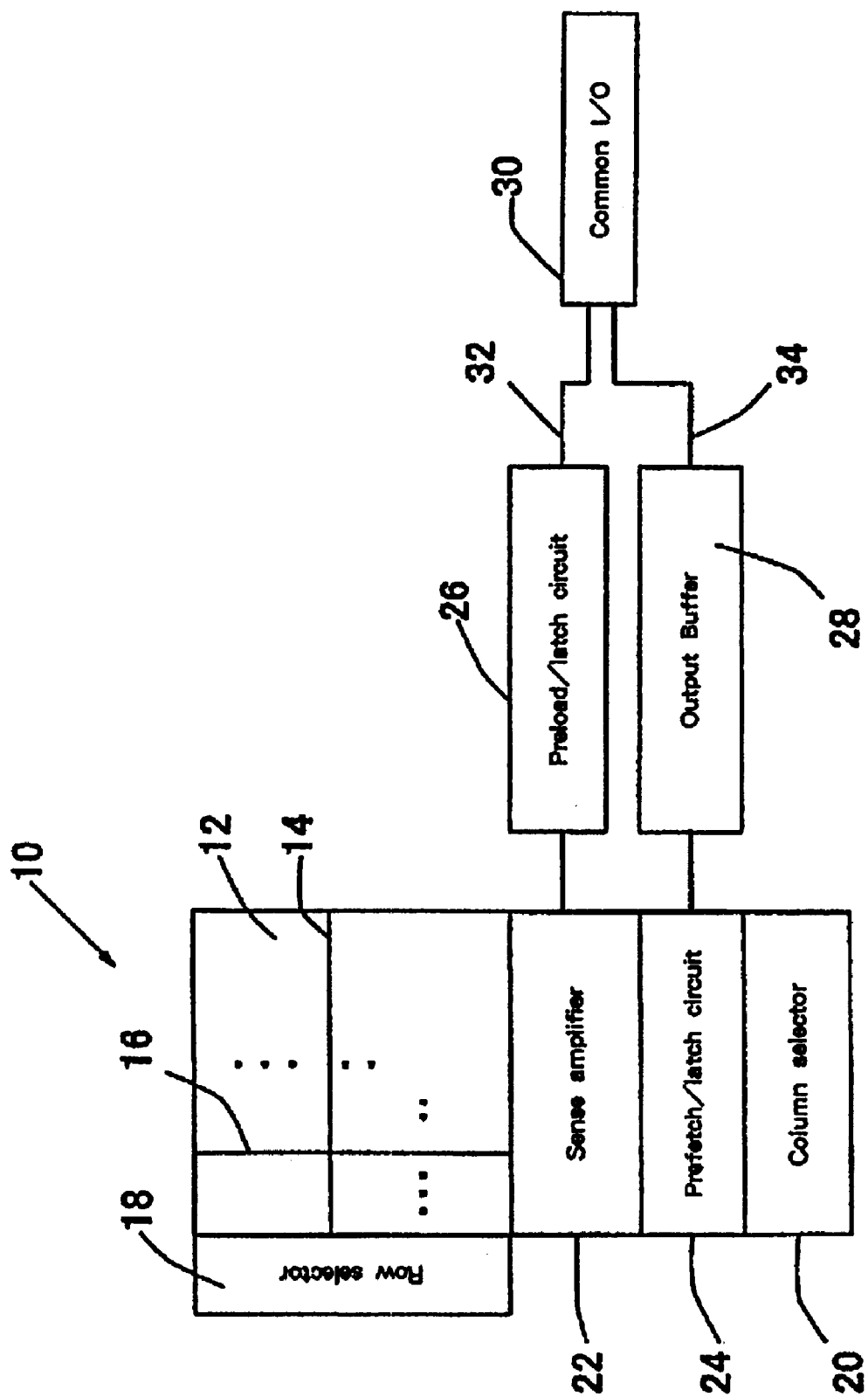
FIG. 1 is a schematic diagram of a memory according to the present invention.

As shown in FIG. 1, a memory according to the present invention will be described with reference to DRAM 10 which comprises prefetch/latch circuit 24 and preload/latch circuit 26. Prefetch/latch circuit 24 comprises means for holding predetermined data from memory array 12 upon m-th (m is integer) read command; means for outputting the predetermined data to common I/O 30 upon (m+1)-th read command; and means for holding new data from memory array 12 upon (m+1)-th read command. Preload/latch circuit 26 comprises means for holding predetermined data from common I/O 30 upon n-th (n is integer) write command; means for storing the predetermined data in memory array 12 upon (n+1)-th write command; and means for holding new data from common I/O 30 upon (n+1)-th write command.

Moreover, as with a typical DRAM, DRAM 10 of the present invention comprises memory array 12 for storing data, row selector 18 for selecting a word line 14 of memory array 12, column selector 20 for selecting a bit line 16 of memory array 12, sense amplifier 22 where data in word line 14 selected by row selector 18 are read, and output buffer 28 connected to prefetch/latch circuit 24. Furthermore, data input line 32 and data output line 34 connected to preload/latch circuit 26 and output buffer 28, respectively, are connected to common I/O 30.

For DRAM 10, data latched into prefetch/latch circuit 24 and preload/latch circuit 26 is 8 bit, however, it may be any other multi-bit such as 2, 4 or 16 bit. Memory array 12 is composed of word lines 14 and bit lines 16 in a matrix form, wherein cells are placed at each crossing point of word lines 14 and bit lines 16, where data are stored. Memory array 12 is divided into multiple blocks, wherein data are input and output for each block.

Figure 7:
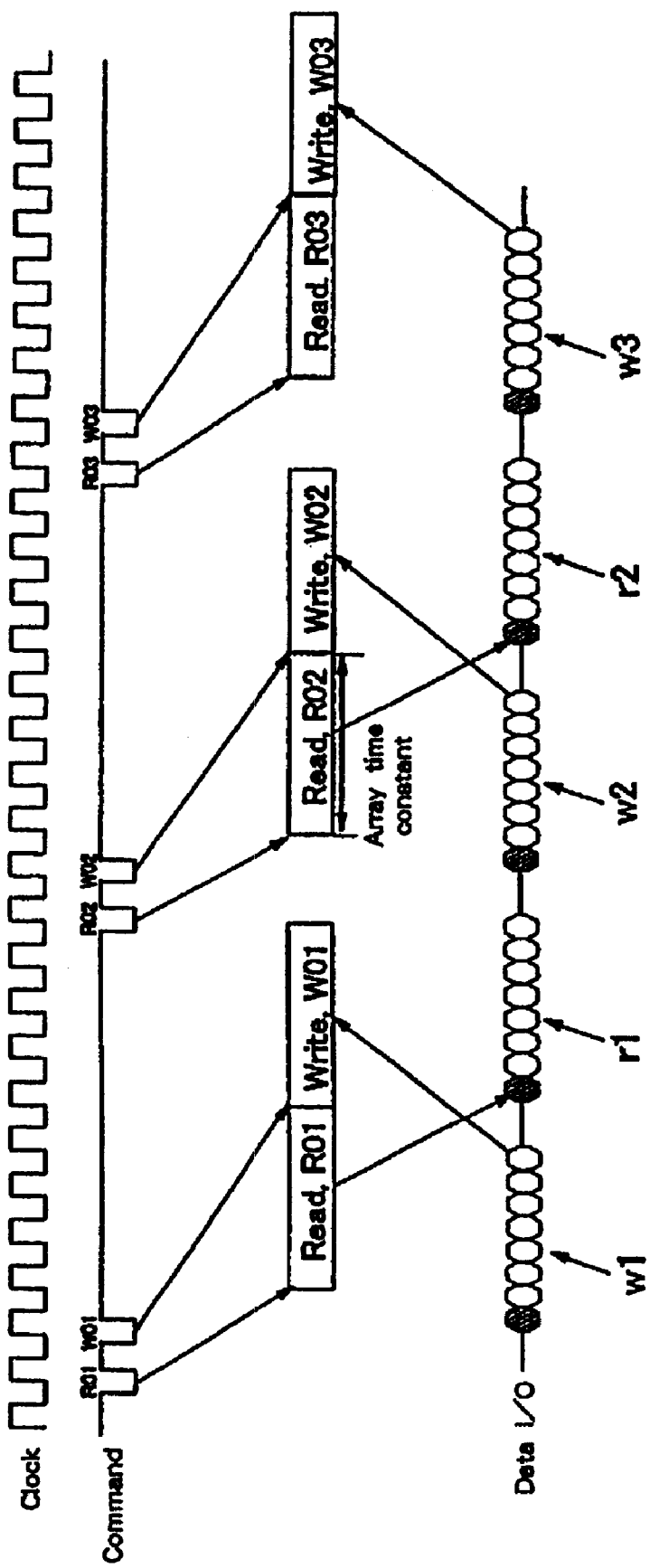
FIG. 7 is a diagram illustrating data input/output where data reading and writing shown in FIG. 6 is made more complex.

Next the method for data input/output for DRAM 10 will be described. The cause of the long empty time period between the bursts for the background art shown in FIG. 7 is due to the fact that temporal relative positions of three factors, including a command, an array time constant and a burst, are much different between reading and writing. This is proved from the fact that the bursts are not interrupted at all in the case of only reading or only writing. On the contrary, if the temporal relative positions of these three factors could be identical between reading and writing, an access will not be interrupted for any combination of reading and writing.

Figure 2:
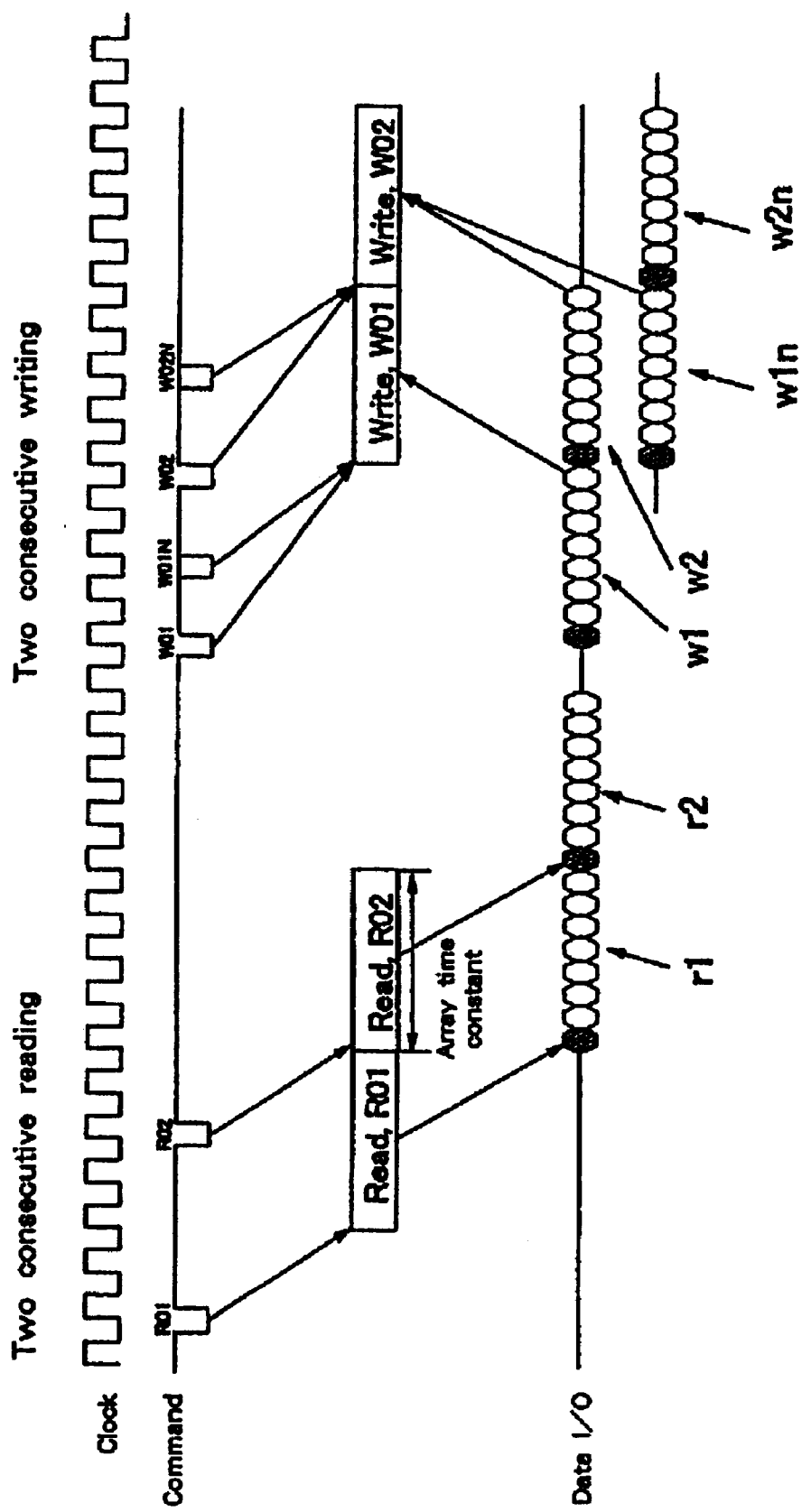
FIG. 2 is a diagram illustrating data input/output where data reading and writing occurs respectively two times consecutively.

Therefore, the present invention attempts to match three factors of writing to those of reading, whose procedure is shown in FIG. 2. Note that Rm refers to the m-th (m is integer) read command, while Wn refers to the n-th (n is integer) write command. Furthermore, rectangular frameworks shown in the middle of FIG. 2 represent array time constants. In FIG. 2, read data subject to command Rm is represented as rm, while write data subject to command Wn is represented as wn.

As is seen from FIG. 2, read command R01 is placed two clocks before the array time constant, and the burst of data r1 is in the same timing as the array time constant after the next read command R02. By contrast, write command W01 is placed four clocks before the array time constant because this is adjusted to the head of write data w1. Since word line 14 begins to be moved at the head of the array time constant, it is moved to W01N, that is, two clocks before the array time constant, just as is done with read command R01.

Then, concerning the burst position of write data w1, since the burst can not be started before the command, it is delayed for four clocks to be the same timing as the array time constant of W01 with maintaining two clocks of write latency. Namely, data w1 is moved to a position w1n. However, since writing is impossible for the array time constant with respect to this timing, the burst transfer is performed by W01N command for the time period corresponding to the array time constant of original W02, in order to write data latched in preload/latch circuit 26 into the cell of memory array 12. As a result, temporal relative positions of the commands to the array time constants become the same for reading and writing. Accordingly, write data is changed from the upper one to the lower one as shown in data I/O in FIG. 2.

In this condition, although commands and array time constants are temporally aligned, there is a difference in terms of burst positions between reading and writing in that the burst is aligned with a subsequent array time constant in reading, while it is aligned with a previous array time constant in writing. That is, from a viewpoint of array time constant, the burst positions are displaced from each other in the opposite direction by an amount of one array time constant between reading and writing. For this reason, if reading and writing occur consecutively, array time constants will be put adjacent to each other while burst positions for reading and writing will completely overlap, thus eventually the burst positions must be displaced by one or more bursts, resulting in long empty periods. In order to eliminate the empty periods between bursts under the condition that reading and writing occur in a mixed manner, there is needed flexibility to change the relative positions of the array time constants to the bursts while maintaining the relative positions of the commands to the array time constants to be constant.

Such a scheme is performed by setting the contents of command processing as follows. That is, for writing, data w1n subject to burst for command W01N is held in preload/latch circuit 26, however, it will be written to the cell for the second array time constant after completion of the burst. It is assumed that an address (word line and bit line) is ignored upon command W01N, which is simply recognized as the beginning of burst with latency of two (i.e., the beginning should be two clocks later). It is also assumed that the second command W02N is to be a command that starts the second burst just as the first time, wherein data w1n subject to burst for command W01N is written to the cell of the input address. In this way, the present invention is a two-stage command scheme that uses commands in two stages to complete a write operation for a series of bursts.

Though the timing for reading is not changed, the command is processed by the two-stage command scheme just as writing. It is assumed that an address is provided and data r1 is latched into prefetch/latch circuit 24 upon command R01, while the burst is started upon the arrival of next read command R02. R02 serves as a command that receives the second address contemporaneously and starts activation of the next block.

In summary, the present invention comprises the steps of: holding predetermined data from memory array 12 upon m-th read command; outputting the predetermined data to common I/O 30 and holding new data from memory array 12 upon (m+1)-th read command; holding predetermined data from common I/O 30 upon n-th write command; and storing the predetermined data in memory array 12 and holding new data form common I/O 30 upon (n+1)-th write command.

For the two-stage command scheme, it is convenient to be able to distinguish a last command for reading and first command for writing, respectively, for a group of certain continuous accesses. Therefore, there is considered a method for providing an identification signal, i.e., an end point signal. For example, when this signal is high for writing, it is recognized as the first command of a group of continuous accesses, wherein the address is ignored and the block is not activated and the signal is simply handled as the beginning of the burst of write data.

On the other hand, when this identification signal is high for reading, it is recognized as the last command of a group of continuous accesses, wherein the burst of read data is started, which has previously been latched in the prefetch/latch circuit and the activation of the next block is not performed.

In an alternative method, the last command is distinguished by a pulse width, without providing a signal line for the identification signal. In this case, a command is enabled if it is low on the rising edge of the clock, wherein the last command is distinguished if it is low on the falling edge of the previous clock and still low on the rising edge of the next clock. Namely, for such a command having a wider pulse width by ½ clock, which is detected to be low on the falling edge of the clock, the address is ignored and the block is not activated for both reading and writing, wherein the command is handled as a kick signal for the burst.

As described above, FIG. 2 depicts that the bursts are tied together when only reading or writing occurs continuously. With this two-stage command scheme, even when any combination of reading and writing occurs, the bursts can be processed without interruption between data input and data output by flexibly adjusting relative positions of the array time constants to the bursts for alignment dependent on the sequence of reading and writing. Now an embodiment thereof will be described.

Figure 3:
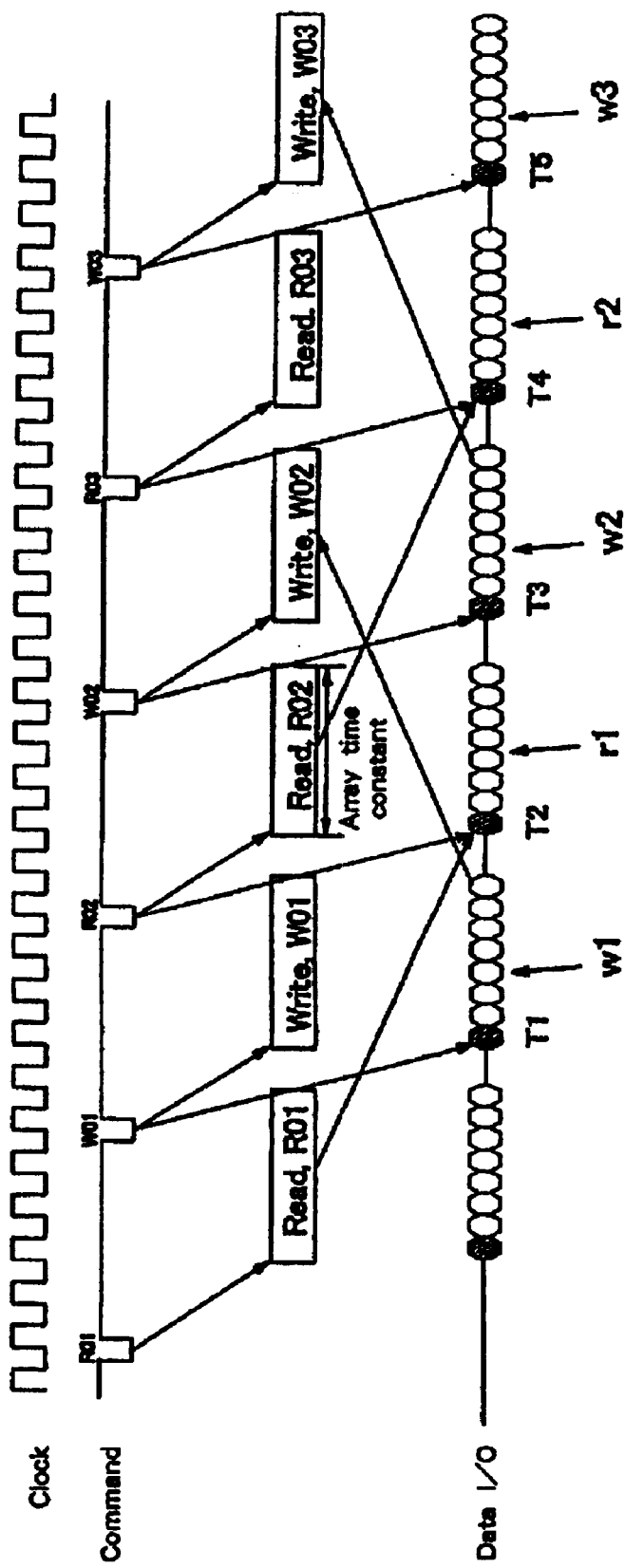
FIG. 3 is a diagram illustrating data input/output where data reading and writing is performed alternately.

FIG. 3 depicts a simple case where read commands and write commands occur alternately. Since a read address is provided upon R01, 8 bit burst data r1 is latched into prefetch/latch circuit 24 and held therein because there is no next read command to kick the burst. A next command is write command W01, so the burst for writing will begin at T1 while maintaining a delay of two latency, however, the address at this time is ignored and the input data w1 is held in preload/latch circuit 26 since there is no second write command.

Next, when read command R02 occurs, the first read data r1 latched in prefetch/latch circuit 24 is kicked of its burst at T2, as well as the next occurring read address is acquired to activate this block. Then, when write command W02 occurs, the next burst input is kicked at T3 as well as data w1 that was held in preload/latch circuit 26 at T1 is written to memory array 12.

Figure 4:
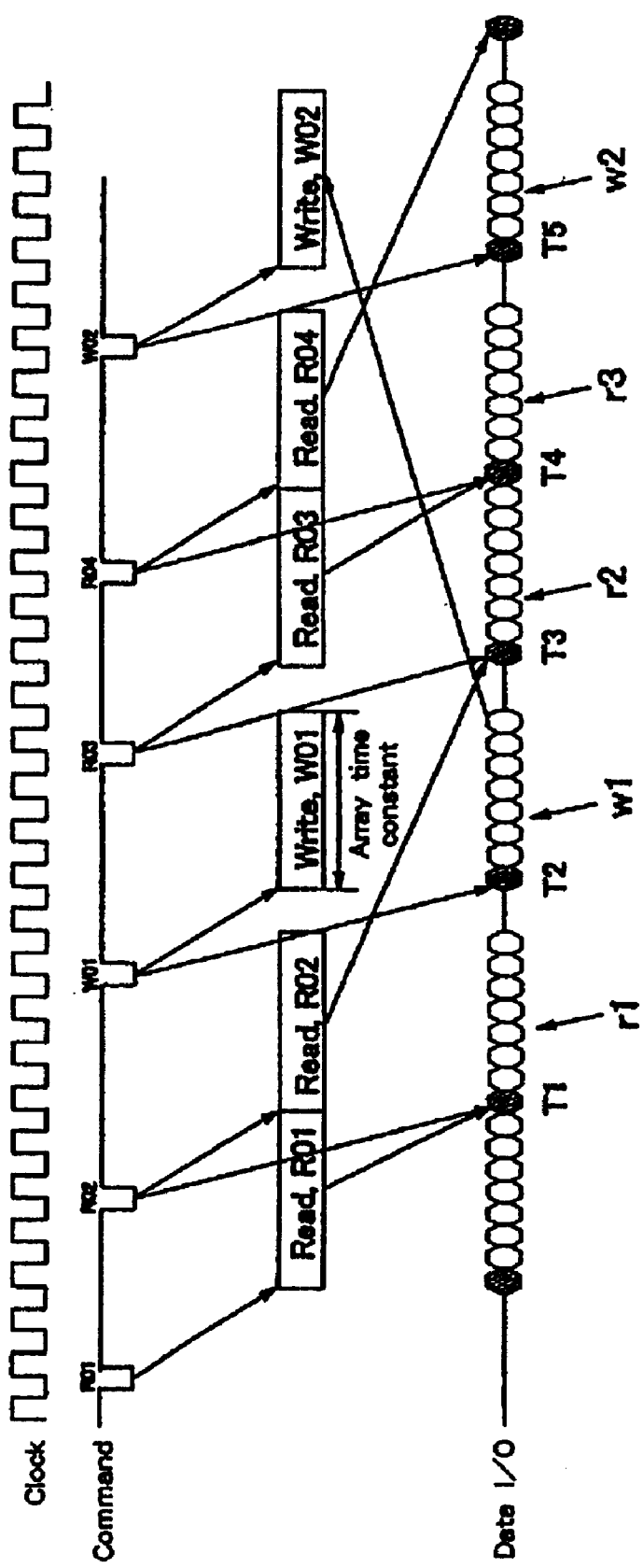
FIG. 4 is a diagram illustrating data input/output where two consecutive times of data reading and subsequent data writing are repeated.
Figure 5:
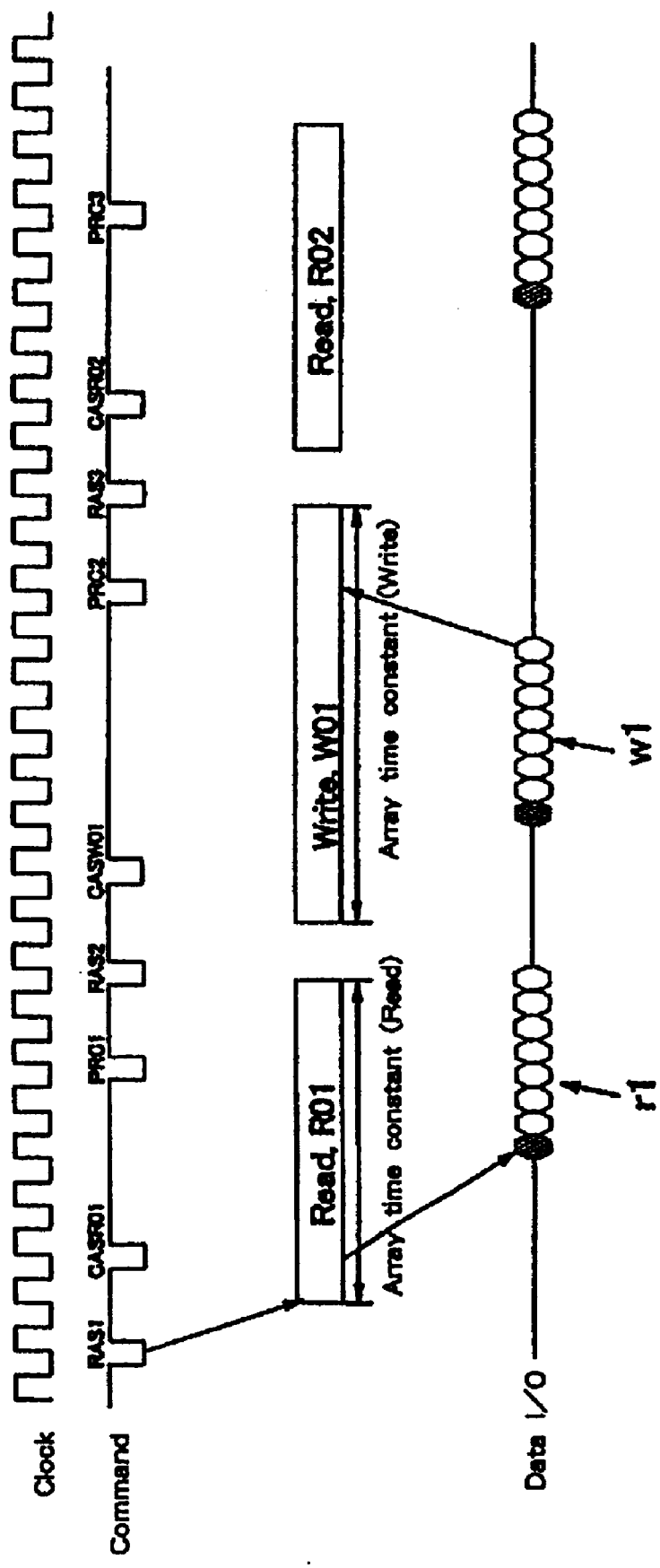
FIG. 5 is a diagram illustrating a data input/output scheme.
Figure 6:
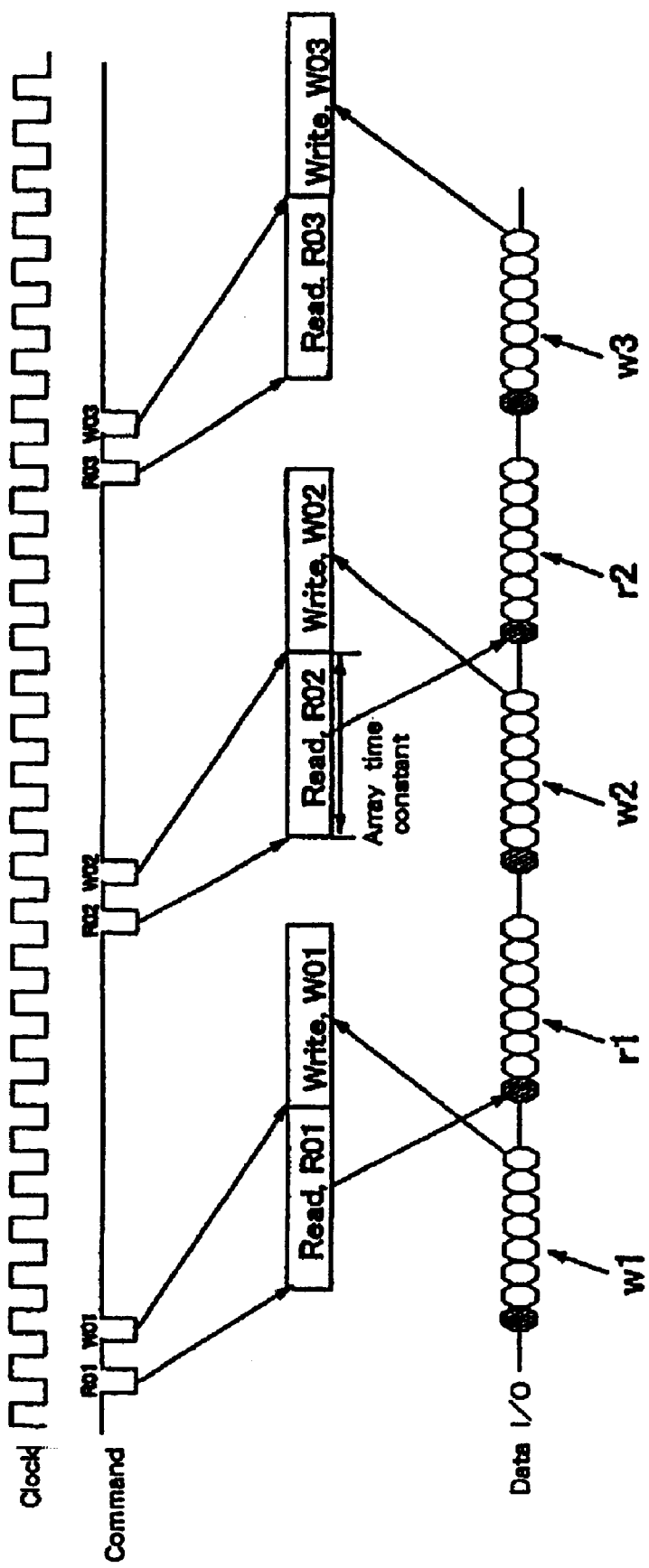
FIG. 6 is a diagram illustrating another data input/output scheme.

FIG. 4 depicts a case where read command occurs two times consecutively and after that write command occurs one time, whose pattern will be repeated thereafter. As shown, consecutive reading is tied without an empty period since no bus contention occurs between bursts, while one clock of the empty period is provided to avoid bus contention when switching between reading and writing.

As described above, the two-stage command scheme can maintain the practical data rate at a peak data rate by aligning temporal relative positions of read and write commands to the array time constants and flexibly adjusting those of the array time constants to the bursts. This is proved using the aforementioned patterns, however, which is applicable to any combination of reading and writing. Though there is provided one clock of empty period to avoid contention on the data I/O bus when reading and writing are switched, no empty period may exist between the bursts if reading continues as shown in FIG. 4. Likewise, if continuous writing occurs, the bursts may be completely tied to each other. Therefore, the worst data rate in practical use would be that in the case of FIG. 3 where reading and writing occurs alternately, wherein the data rate is 80% (=8/10). This means that data input/output is performed using the edges of four clocks among those of five clocks. A high utilization rate of 80% in the worse case can not be achieved by any other methods. If there is provided a mechanism for avoiding bus contention, one clock of empty period is unnecessary, thereby enabling a true random row access with a peak data rate of 100%, wherein completely seamless reading and writing is performed for any combination of reading and writing, and any address.

Though an individual access time varies dependent on what the next command is, any system may cause continuous accesses rather than reading or writing one-by-one when it wants to process a large amount of data at a high speed. Therefore, it is not an obstacle that the access time is slow, but what is most important is how to bring the practical data rate close to a possible peak data rate of the memory system. Accordingly, the present invention provides great advantages wherein completely seamless accesses are achieved by random row access.

With the two-stage command scheme, since the first write command simply kicks the burst and the address must wait until the next command, the first command is considered a dummy command. On the other hand, for reading, a read command is necessary as a dummy command at the end, thus the read command is considered as overhead. However, in a practical system, overhead of the two-stage command scheme can be completely ignored since access occur continuously for a long time.

Furthermore, a flexible access method can be used depending on a combination of reading and writing. For example, if reading and writing are switched frequently, the second command that completes a series of cycles occurs relatively early as shown in FIG. 3 and FIG. 4, thus it is useful to provide an identification signal at the first write and at the last read, respectively, in a group of continuous accesses.

When either one of read command or write command occurs many times while the other occurs rarely, it may be useful to provide an identification signal to complete the operation of the latter quickly because it may take a long time for the second command of the latter to occur and consequently take much time to complete the operation thereof. For example, if only one write command occur while several tens of read commands occur, the identification signal may be asserted high at every write command and right after its array time constant, then the write command and identification signal are made low again and the address is input in order to complete writing to the cell.

The method for data input/output for memory has been described, however, it should be understood that the present invention is not limited to the above-mentioned embodiments. For example, the present method has been applied to both reading and writing, however, the method may be applied only to data reading or data writing. Furthermore, the present invention may be improved, modified or changed in various forms by those skilled in the art without departing the spirit and scope of the present invention.

As mentioned above, according to the inventive method for data input/output for DRAM, and DRAM using thereof, data can be accessed without interruption except for empty periods for preventing data contention even when switching between reading and writing occurs on the common I/O. Though this scheme is applicable to all memories using common I/O, a true random row access performance is achieved that can always maintain a peak data rate for any address and for any switching between reading and writing by applying it to memory that is capable of seamless row-to-row access.

What is claimed is:

1. A method for data input/output for a memory, the method comprising the steps of:
   providing an output which reads data;
   holding first data from a memory array upon a first read command; and
   outputting said first data to said output and holding second data from the memory array upon a second read command, wherein said second read command is subsequent to said first read command.

2. The method according to claim 1, further comprising the steps of:
   identifying a last read command for a plurality of read commands; and
   outputting data which is held when said last read command is identified to said output.

3. The method according to claim 1, wherein the step of outputting said first data to said output comprises said data as multiple bits of burst.

4. The method according to claim 1, wherein the step of providing comprises providing a common I/O.

5. A method for data input/output for a memory, the method comprising the steps of:
   providing an input which writes data;
   holding first data from said input upon a first write command; and
   storing said first data in a memory array and holding second data from said input upon a second write command, wherein said second write command is subsequent to said first write command.

6. The method according to claim 5, further comprising the steps of:
   identifying a last write command for a plurality of write commands; and
   storing data which is held when said last write command is identified in the memory array.

7. The method according to claim 5, wherein the step of storing said first data to the memory array comprises storing said data as multiple bits of burst.

8. The method according to claim 5, wherein the step of providing comprises providing a common I/O.

9. A memory comprising:
   a prefetch/latch circuit which holds data from memory array; and,
   a preload/latch circuit which holds data from an output, wherein said prefetch/latch circuit holds first data from the memory array upon a first read command, outputs said first data to said output upon a second read command, and holds second data from the memory array upon said second read command, further wherein said second read command is subsequent to said first read command.

10. The device according to claim 9, further comprising means for appending an identification signal to a last read command for a plurality of read commands, the identification signal indicating the last read command.

11. A memory comprising:
   a prefetch/latch circuit which holds data from a memory array; and,
   a preload/latch circuit which holds data from an input, wherein said preload/latch circuit holds first data from said input upon a first write command, stores said first data in the memory array upon a second write command, and holds second data from said input upon said second write command.

12. The memory according to claim 11, further comprising means for appending an identification signal to a first write command for a plurality of write commands, the identification signal indicating the first write command.

* * * * *